United States Patent
Jung

(10) Patent No.: US 7,482,212 B2
(45) Date of Patent: Jan. 27, 2009

(54) SEMICONDUCTOR DEVICE AND MANUFACTURING METHOD THEREOF

(75) Inventor: Jin-Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 197 days.

(21) Appl. No.: 11/319,697

(22) Filed: Dec. 29, 2005

(65) Prior Publication Data

US 2007/0077695 A1 Apr. 5, 2007

(30) Foreign Application Priority Data

Oct. 4, 2005  (KR) ............... 10-2005-0092926

(51) Int. Cl.
*H01L 21/84* (2006.01)
(52) U.S. Cl. ............... 438/164; 438/197; 438/301; 438/305; 257/E21.415
(58) Field of Classification Search ............. 438/301, 438/164, 166, 197, 305
See application file for complete search history.

(56) References Cited

U.S. PATENT DOCUMENTS

| 5,437,762 A | * | 8/1995 | Ochiai et al. | 438/144 |
| 5,444,282 A | * | 8/1995 | Yamaguchi et al. | 257/344 |
| 5,597,739 A | * | 1/1997 | Sumi et al. | 438/164 |
| 6,743,666 B1 | * | 6/2004 | Chan | 438/151 |

* cited by examiner

*Primary Examiner*—Michael Trinh
(74) *Attorney, Agent, or Firm*—Lowe Hauptman Ham & Berner, LLP

(57) ABSTRACT

A method of manufacturing a semiconductor device including forming a trench on a first surface of a silicon substrate, forming a thermal oxide layer and a deposited oxide layer on the trench and the silicon substrate, planarizing a second surface of the silicon substrate by a chemical mechanical polishing (CMP) process, and forming a transistor on the second surface of the silicon substrate. The semiconductor device and the method of manufacturing the same provide an SOI device that has low resistance of the source/drain regions and suppress a short channel effect.

9 Claims, 2 Drawing Sheets

SEMICONDUCTOR DEVICE AND MANUFACTURING METHOD THEREOF

CROSS-REFERENCE TO RELATED APPLICATION

This application claims priority to and the benefit of Korean Patent Application No. 10-2005-0092926 filed in the Korean Intellectual Property Office on Oct. 4, 2005, the entire contents of which are incorporated herein by reference.

BACKGROUND OF THE INVENTION (a) Field of the Invention

The present invention relates to a semiconductor device and a method of manufacturing the same.

(b) Description of the Related Art

Generally, in a silicon oxide insulator (SOI) device, a transistor is formed on an SOI wafer by using a complimentary metal oxide semiconductor (CMOS) process. The SOI device is used for a high performance semiconductor device. The SOI wafer is a wafer wherein an insulation layer and a silicon single-crystal layer are accumulated on a silicon single-crystal substrate. In the SOI wafer, a thin insulation layer is formed between a wafer surface wherein circuits are formed and a silicon single-crystal substrate, so a parasitic capacitance can be reduced. In addition, the operation speed of the SOI device can be enhanced, and the operating voltage thereof can be lowered.

However, the SOI wafer is difficult to manufacture, so the manufacturing cost thereof is high. In addition, the silicon single-crystal layer may be very thin, so the resistance of a source/drain region may be very high.

Therefore, an SOI device and a manufacturing method thereof that can lower the parasitic resistance of a source/drain region and suppress a short channel effect are required.

The above information disclosed in this Background section is only for enhancement of understanding of the background of the invention and therefore it may contain information that does not form part of the prior art with respect to the present invention.

SUMMARY OF THE INVENTION

The present invention has been made in an effort to provide a semiconductor device and a method of manufacturing the same having advantages of providing an SOI semiconductor device having low resistance of a source/drain region and high performance.

An exemplary method of manufacturing a semiconductor device according to an embodiment of the present invention includes forming a trench on a first surface of a silicon substrate; forming a thermal oxide layer and an oxide layer on the trench and the silicon substrate; planarizing a second surface of the silicon substrate by a chemical mechanical polishing (CMP) process; and forming a transistor on the second surface of the silicon substrate.

In a further embodiment, the step of forming the transistor can include forming a gate electrode on the second surface of the silicon substrate over the trench; forming an extended source/drain region on the second surface of the silicon substrate by implanting ions using the gate electrode as an implantation mask; forming a pair of spacers on the sidewalls of the gate electrode; and forming a source/drain region by implanting ions using the gate electrode and the spacers as an implantation mask.

In addition, a depth of the extended source/drain region can be shallower than that of the source/drain region.

A channel region of the transistor can be formed under the gate electrode.

The deposited oxide layer can fill the trench.

In addition, a spacing distance between a bottom of the trench and the second surface of the silicon substrate can be 100 to 500 Å, or 500 to 50,000 Å.

An exemplary semiconductor device according to an embodiment of the present invention includes a trench formed on a first surface of a silicon substrate; a thermal oxide layer formed on the trench and the first surface; a deposited oxide layer filling the trench on the thermal oxide layer; and a transistor formed on the second surface of the silicon substrate, and the deposit oxide layer can be planarized.

In addition, the transistor can include a gate electrode formed on the second surface of the silicon substrate over the trench, a source/drain region formed at a position exterior to the gate electrode in the second surface of the silicon substrate, and an extended source/drain region formed between the gate electrode and the source/drain region.

A pair of spacers can be formed on both sidewalls of the gate electrode, and a channel region of the transistor can be formed between the extended source/drain regions.

The channel region and the extended source/drain region can be formed on the trench, and a depth of the channel region and the extended source/drain region can be shallower than that of the source/drain region.

In addition, a spacing distance between a bottom of the trench and the second surface of the silicon substrate can be 100 to 500 Å, or 500 to 50,000 Å.

The semiconductor device and the method of manufacturing the same according to the exemplary embodiment of the present invention can provide an SOI device that has a low resistance of a source/drain and can suppress a short channel effect.

DETAILED DESCRIPTION OF THE EMBODIMENTS

Figure 1:
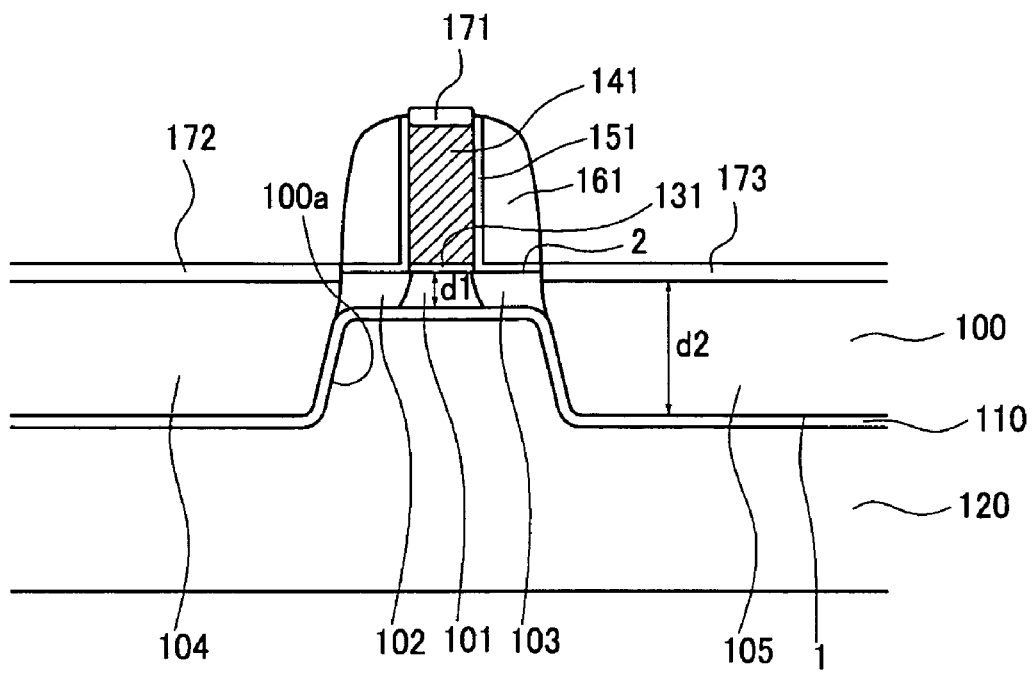
FIG. 1 is a cross-sectional view showing a semiconductor device according to an exemplary embodiment of the present invention.

An exemplary embodiment of the present invention will hereinafter be described in detail with reference to the accompanying drawings. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

Now, an exemplary semiconductor device according to an embodiment of the present invention will be described in detail with reference to the accompanying drawings.

FIG. 1 is a cross-sectional view showing a semiconductor device according to an exemplary embodiment of the present invention.

As shown in FIG. 1, a semiconductor device according to an exemplary embodiment of the present invention includes a trench 100a formed on a first surface 1 of a silicon substrate 100; a thermal oxide layer 110 formed on the trench 100a and the first surface 1; a deposited oxide layer 120 filling the trench 100a on the thermal oxide layer 110; and a transistor formed on the second surface 2 of the silicon substrate 100. The deposited oxide layer 120 can be planarized.

The transistor includes a gate insulation layer 131, a gate electrode 141, source/drain regions 104, 105, and extended source/drain regions 102, 103. The gate electrode 141 is formed on the second surface 2 of the silicon substrate 100 over the trench 100a. The source/drain regions 104, 105 are formed at a position exterior to the gate electrode 141 in the second surface 2 of the silicon substrate 100. The extended source/drain regions 102, 103 are formed between the gate electrode 141 and the source/drain regions 104, 105. In addition, a liner layer 151 or a pair of spacers 161 can be formed on both sidewalls of the gate electrode 141. A channel region of the transistor is formed between the extended source/drain regions 102, 103. The channel region 101 and the extended source/drain regions 102, 103 are formed on the trench 100a. The depth d1 of the channel region 101 and the extended source/drain regions 102, 103 are shallower than the depth d2 of the source/drain region 104, 105. In addition, silicide layers 171, 172, and 173 are formed on the gate electrode 141 and the source/drain regions 104 and 105.

An exemplary method of manufacturing a semiconductor device according to an embodiment of the present invention will hereinafter be described in detail with reference to the accompanying drawings.

Figure 2:
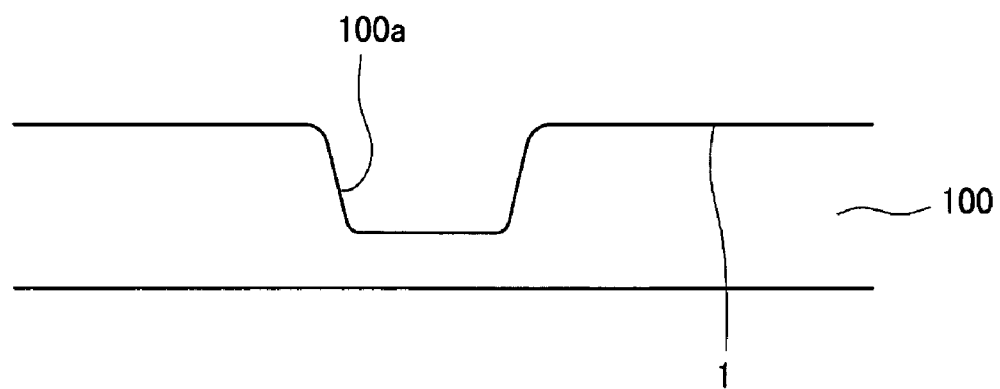
FIG. 2 to FIG. 4 are cross-sectional views showing principal stages of a semiconductor device according to an exemplary embodiment of the present invention.
Figure 3:
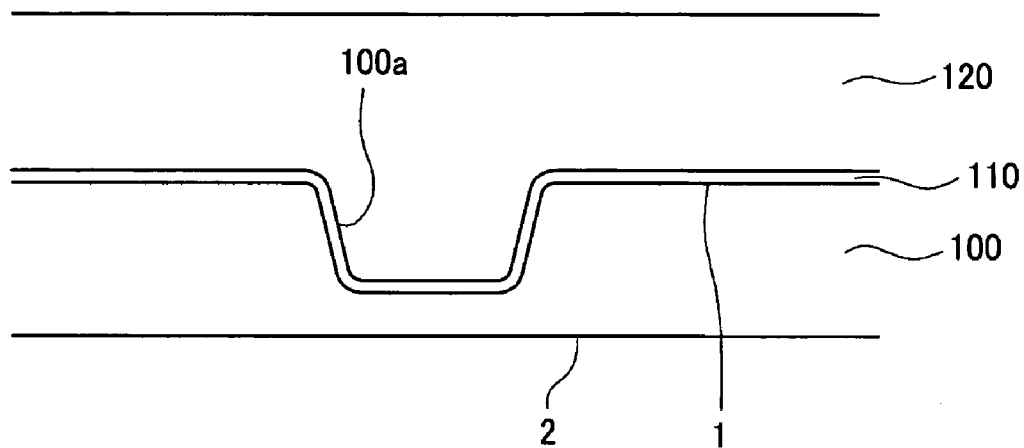
Figure 4:
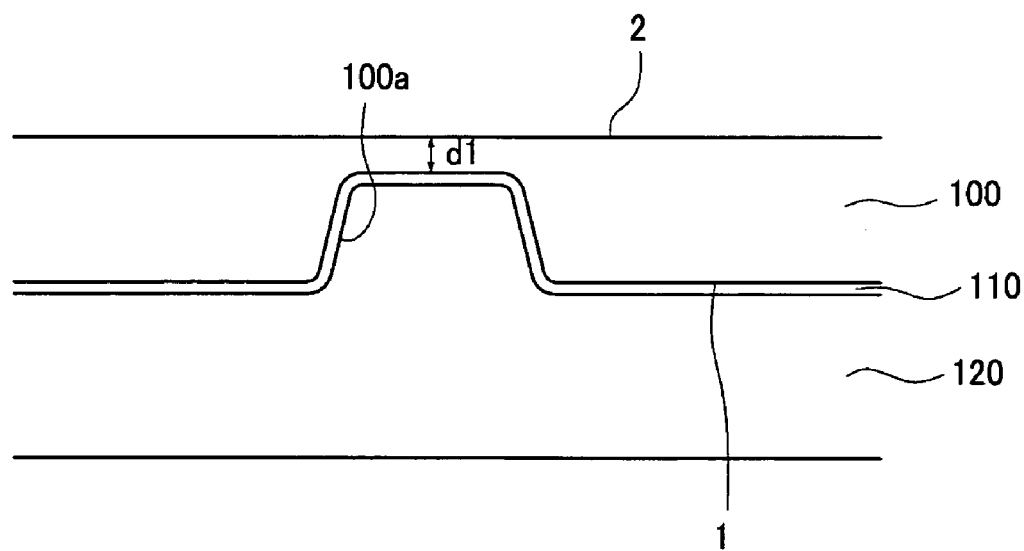

FIG. 2 to FIG. 4 are cross-sectional views showing principal stages of a semiconductor device according to an exemplary embodiment of the present invention.

First, as shown in FIG. 2, a trench 100a is formed on a first surface 1 of a silicon substrate 100. The trench 100a is formed in a region wherein a gate electrode 141 will be formed.

Subsequently, as shown in FIG. 3, a thermal oxide layer 110 is formed on the trench 100a and the silicon substrate 100. A thin thermal oxide layer 110 is formed on the trench 100a and the silicon substrate 100. In addition, an oxide layer 120 is formed using a chemical vapor deposition (CVD) process. The deposited oxide layer 120 can fill the trench 100a and have a greater thickness than that of the thermal oxide layer 110. In addition, the deposited oxide layer 120 can be highly densified to have hardness similar to that of the thermal oxide layer 110 by a densification process.

Subsequently, as shown in FIG. 4, after turning over the silicon substrate 100, the second surface 2 of the silicon substrate 100 can be planarized by a chemical mechanical polishing (CMP) process.

At this time, it is preferable that the spacing distance d1 between the bottom of the trench 100a and the second surface 2 of the silicon substrate 100 is 100 to 500 Å. An exemplary embodiment of the present invention is for a fully depleted SOI device, so the preferable spacing distance d1 between a bottom of the trench 100a and the second surface 2 of the silicon substrate 100 is 100 to 500 Å. However, in a partially depleted SOI device, the spacing distance d1 can be 500 to 50,000 Å.

Subsequently, as shown in FIG. 1, a transistor is formed on the second surface 2 of the silicon substrate 100. This will now be described in detail.

First, the gate electrode 141 is formed on the second surface 2 of the silicon substrate 100 over the trench 100a. In addition, extended source/drain regions 102, 103 are formed on the second surface 2 of the silicon substrate 100 by implanting ions using the gate electrode 141 as an implantation mask. The extended source/drain regions 102, 103 are formed on the trench 100a. Therefore, at the second surface 2 of the silicon substrate 100, a channel region 101 of the transistor is formed under the gate electrode 141 and on the trench 100a. Therefore, the depth d1 of the channel region 101 is the same as the depth of the extended source/drain regions 102, 103.

In order to reduce the parasitic resistance of the extended source/drain regions 102, 103, the concentration of implanted ions can be increased. The extended source/drain regions 102, 103 are formed in a region that is defined to a thickness d1 of the channel region 101 by the trench 100a, so a short channel effect can be effectively suppressed and the parasitic resistance of the extended source/drain region 102, 103 can be reduced.

Subsequently, a pair of spacers 161 can be formed on the gate electrode 141. Source/drain regions 104, 105 are formed by implanting ions using the gate electrode 141 and the spacer 161 as an implantation mask. The source/drain regions 104, 105 can be formed deep in a region except at a region above the trench 100a region. Therefore, the depth d2 of the source/drain regions 104, 105 are deeper than the depth d1 of the extended source/drain regions 102, 103.

As described above, the depth of the channel region 101 and the extended source/drain regions 102, 103 can be very thin, so a fully depleted SOI device can be effectively manufactured and a short channel effect can be effectively suppressed. The source/drain regions 104, 105 can be formed much deeper than the channel region 101, so the parasitic resistance of the source/drain can be reduced.

In addition, silicide layers 171, 172, and 173 can be formed on the gate electrode 141 and the source/drain regions 104, 105 so as to improve a contact resistance. The silicide layers 171, 172, and 173 are formed to a depth such that contact resistance can be improved, so the characteristics of the source/drain regions 104, 105 can be maintained due to the deep formation of the source/drain regions 104, 105.

The semiconductor device and the method of manufacturing the same according to the exemplary embodiment of the present invention can provide an SOI device that has low resistance of a source/drain and suppresses a short channel effect.

In addition, a typical silicon substrate is used and some typical processes are added in the production of the SOI device, so total manufacturing cost can be effectively reduced as compared to conventional SOI devices.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device, comprising:

forming a trench on a first surface of a silicon substrate;

forming a thermal oxide layer on the trench and the silicon substrate;

depositing an oxide layer on the trench and the silicon substrate;

overturning the silicon substrate;

planarizing a second surface of the silicon substrate by a chemical mechanical polishing (CMP) process; and forming a transistor on the second surface of the silicon substrate wherein the forming of the transistor comprises:

forming a gate electrode on the second surface of the silicon substrate over the trench;

forming extended source and drain regions on the second surface of the silicon substrate by implanting ions using the gate electrode as an implantation mask;

forming a pair of spacers on the sidewalls of the gate electrode; and forming source and drain regions by implanting ions using the gate electrode and the spacers as an implantation mask, wherein the extended source and drain regions formed on the second surface extend towards the trench and are located in between the gate electrode and the trench; and said gate electrode is located directly above the trench.

2. The method of claim 1, wherein a depth of the extended source/drain regions are shallower than that of the source and drain regions.

3. The method of claim 1, wherein a channel region of the transistor is formed between the gate electrode and the trench.

4. The method of claim 1, wherein the oxide layer fills the trench.

5. The method of claim 1, wherein a spacing distance between a bottom of the trench and the planarized second surface of the silicon substrate is 100 to 500 Å.

6. The method of claim 1, wherein a spacing distance between a bottom of the trench and the planarized second surface of the silicon substrate is 500 to 50,000 Å.

7. A method of manufacturing a semiconductor device, comprising:

forming a trench on a first surface of a silicon substrate;

forming a thermal oxide layer on the trench and the silicon substrate;

depositing an oxide layer on the trench and the silicon substrate;

overturning the silicon substrate;

planarizing a second surface of the silicon substrate by a chemical mechanical polishing (CMP) process; and forming a transistor on the second surface of the silicon substrate, wherein the forming of the transistor comprises:

forming a gate electrode on the second surface of the silicon substrate over the trench;

forming extended source and drain regions on the second surface of the silicon substrate by implanting ions using the gate electrode as an implantation mask;

forming a pair of spacers on the sidewalls of the gate electrode;

forming source and drain regions by implanting ions using the gate electrode and the spacers as an implantation mask; and said extended source and drain regions have a depth lesser than a depth of the source and drain region said spacer divides the extended source and drain regions from the source and drain regions.

8. The method of claim 7, wherein a combined width of the gate electrode, the sidewalls, and the spacer, is equal to a combined width of the extended source and drain regions and the channel region.

9. The method of claim 7, wherein the source and drain regions are located below and exterior to the gate electrode and the spacer.

* * * * *